(12) United States Patent
Meadowcroft et al.

(10) Patent No.: US 7,317,617 B2
(45) Date of Patent: Jan. 8, 2008

(54) TEMPERATURE CONTROL OF HEAT-GENERATING DEVICES

(75) Inventors: David Meadowcroft, Stowmarket (GB); Ian Mitchell, Ipswich (GB); Declan Reilly, Ipswich (GB)

(73) Assignee: Avago Technologies Fiber IP(Singapore) Pte Ltd

( * ) Notice: Subject to any disclaimer, the term of this patent is extended or adjusted under 35 U.S.C. 154(b) by 0 days.

(21) Appl. No.: 11/255,480

(22) Filed: Oct. 21, 2005

(65) Prior Publication Data

US 2006/0086485 A1 Apr. 27, 2006

(30) Foreign Application Priority Data

Oct. 21, 2004 (GB) ................................. 0423344.1

(51) Int. Cl.
*H05K 7/20* (2006.01)
*F28D 15/00* (2006.01)
*G02B 6/36* (2006.01)

(52) U.S. Cl. ...................... 361/715; 361/695; 361/697; 361/704; 165/104.33; 165/122; 385/92

(58) Field of Classification Search ................ 361/715, 361/694–695, 697, 704; 165/80.3, 104.33, 165/122, 185; 385/92
See application file for complete search history.

(56) References Cited

U.S. PATENT DOCUMENTS

| 4,513,351 | A | * | 4/1985 | Davis et al. | ................. 361/695 |
|---|---|---|---|---|---|
| 5,727,624 | A | * | 3/1998 | Ko et al. | ..................... 165/121 |
| 5,740,013 | A | * | 4/1998 | Roesner et al. | ............. 361/697 |
| 5,740,300 | A | | 4/1998 | Hodge | ......................... 385/135 |
| 5,898,568 | A | * | 4/1999 | Cheng | ......................... 361/695 |
| 5,940,269 | A | * | 8/1999 | Ko et al. | ..................... 361/697 |
| 5,963,424 | A | * | 10/1999 | Hileman et al. | ............ 361/695 |
| 6,667,883 | B1 | | 12/2003 | Solis et al. | ................. 361/695 |
| 6,765,794 | B1 | * | 7/2004 | Inoue | ......................... 361/695 |
| 6,788,540 | B2 | * | 9/2004 | Kruger et al. | ............. 361/719 |
| 6,816,376 | B2 | * | 11/2004 | Bright et al. | ............... 361/719 |
| 6,980,437 | B2 | * | 12/2005 | Bright | ......................... 361/704 |
| 7,113,406 | B1 | * | 9/2006 | Nguyen et al. | ............ 361/719 |

FOREIGN PATENT DOCUMENTS

| JP | 11067382 A | 3/1999 |
|---|---|---|
| JP | 2004180166 A | 6/2004 |

OTHER PUBLICATIONS

English machine translation of JP 11-067382 A, Kishimoto, Mar. 1999.*
English machine translation of JP 2004-180166 A, Takeuchi et al., Jun. 2004.*

* cited by examiner

*Primary Examiner*—Jayprakash Gandhi
*Assistant Examiner*—Robert J. Hoffberg

(57) ABSTRACT

A module houses an optical transceiver device and provides a dedicated heat-transfer environment for the device. A fan draws in ambient air and blows it through a heat exchanger and out an exhaust. Heat transfer is by conduction from the device into the heat exchanger through an opening in an EMI shield of the device. In some embodiments the fan is a pluggable unit, allowing quick replacement if status LEDs indicate a fault.

13 Claims, 8 Drawing Sheets

TEMPERATURE CONTROL OF HEAT-GENERATING DEVICES

INTRODUCTION

The invention relates to temperature control of devices such as transceivers (transponders), which generate heat in use.

At present, it is known to provide a rack of such devices, temperature control being achieved by a fan blowing or sucking air over the devices. The fan is typically mounted on the rack or on a cabinet at a position chosen to have best effect on all heat-generating devices. However, it is often not possible to achieve a uniform airflow at all devices and so particular devices may operate at a temperature higher than specified. This, in turn, leads to faults.

This problem has been compounded by the increasing power consumption density of racks of such devices. For example, optical transceivers for high-speed communication have both electronic circuits and lasers or diodes, which consume in the range of 1 to 5 W each. If there are many such components in a rack, considerable heat is generated in a small space. Also, the temperature distribution across a rack of devices is often very uneven. Another problem is that different devices in a rack may have different heat-generating characteristics, and these are not catered for.

Thus, while there has been increased miniaturisation in the electronic circuits and in the optical components of such devices, the heat generated by the devices has been a barrier to achieving greater densities.

The invention addresses these problems.

STATEMENTS OF INVENTION

According to the invention, there is provided a transceiver module comprising a transceiver device, a heat exchanger mounted to receive heat from the transceiver device, and a fan mounted to cause air flow through the heat exchanger.

In one embodiment, the heat exchanger is in physical contact with the device for heat flow by conduction from the device into the heat exchanger.

In another embodiment, the module comprises an EMI shield surrounding at least part of the device, the EMI shield having an opening through which the heat exchanger protrudes for contact with the device.

In a further embodiment, said opening is in a top wall of the EMI shield.

In one embodiment, the module comprises a clamp for pressing the heat exchanger against the device.

In another embodiment, the clamp comprises a plurality of resilient cross-bars extending across the heat exchanger and pressing it down.

In a further embodiment, the module comprises an exhaust for the fan.

In one embodiment, the fan, the heat exchanger, and the exhaust are in-line from a front end of the module to a rear end.

In another embodiment, the fan is bi-directional, for operation either blowing air through the heat exchanger and out the exhaust, or sucking air through the exhaust and the heat exchanger and expelling it through fan top openings.

In a further embodiment, the heat exchanger has open heat exchange elements, allowing passage of surrounding blown air through the elements.

In one embodiment, the module comprises a temperature monitor, and a fan controller for controlling the fan in response to sensed device temperature.

In another embodiment, the fan is removable.

In a further embodiment, the module comprises an electrical connector for supplying power to the fan.

In one embodiment, the connector draws power from a terminal at a terminal block for the device.

In another embodiment, the connector is linked by a conductor extending along the heat exchanger to the terminal block.

In a further embodiment, the module comprises a front opening for receiving the fan.

In one embodiment, the fan and the heat exchanger are an integral removable unit.

DETAILED DESCRIPTION OF THE INVENTION

The invention will be more clearly understood from the following description of some embodiments thereof, given by way of example only with reference to the accompanying drawings in which:—

FIG. 5(*b*) shows the completed module with the fan in place;

Figure 1:
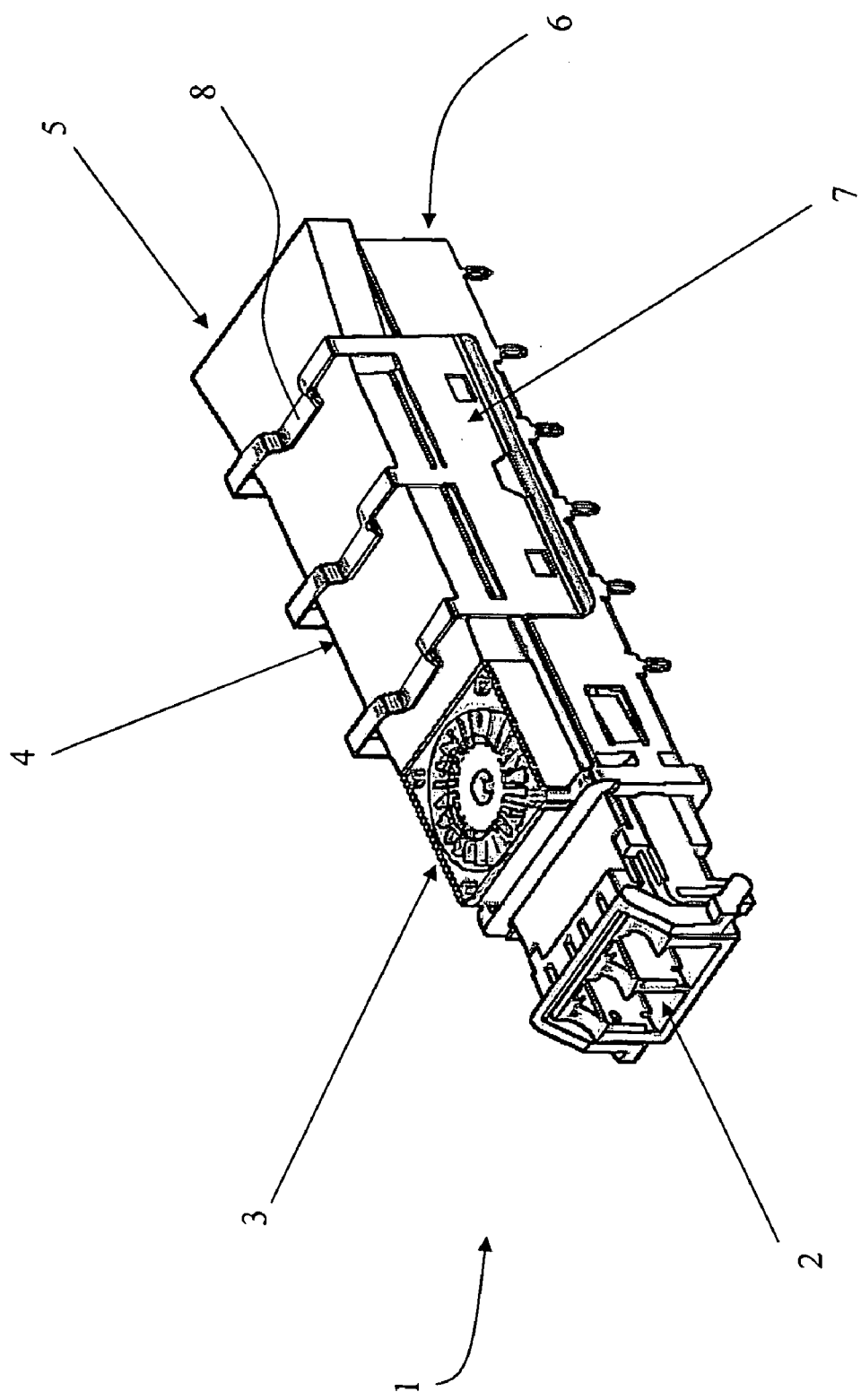
FIG. 1 is a perspective view from above of a module of the invention, having a transceiver device and a dedicated fan and heat exchanger.
Figure 2:
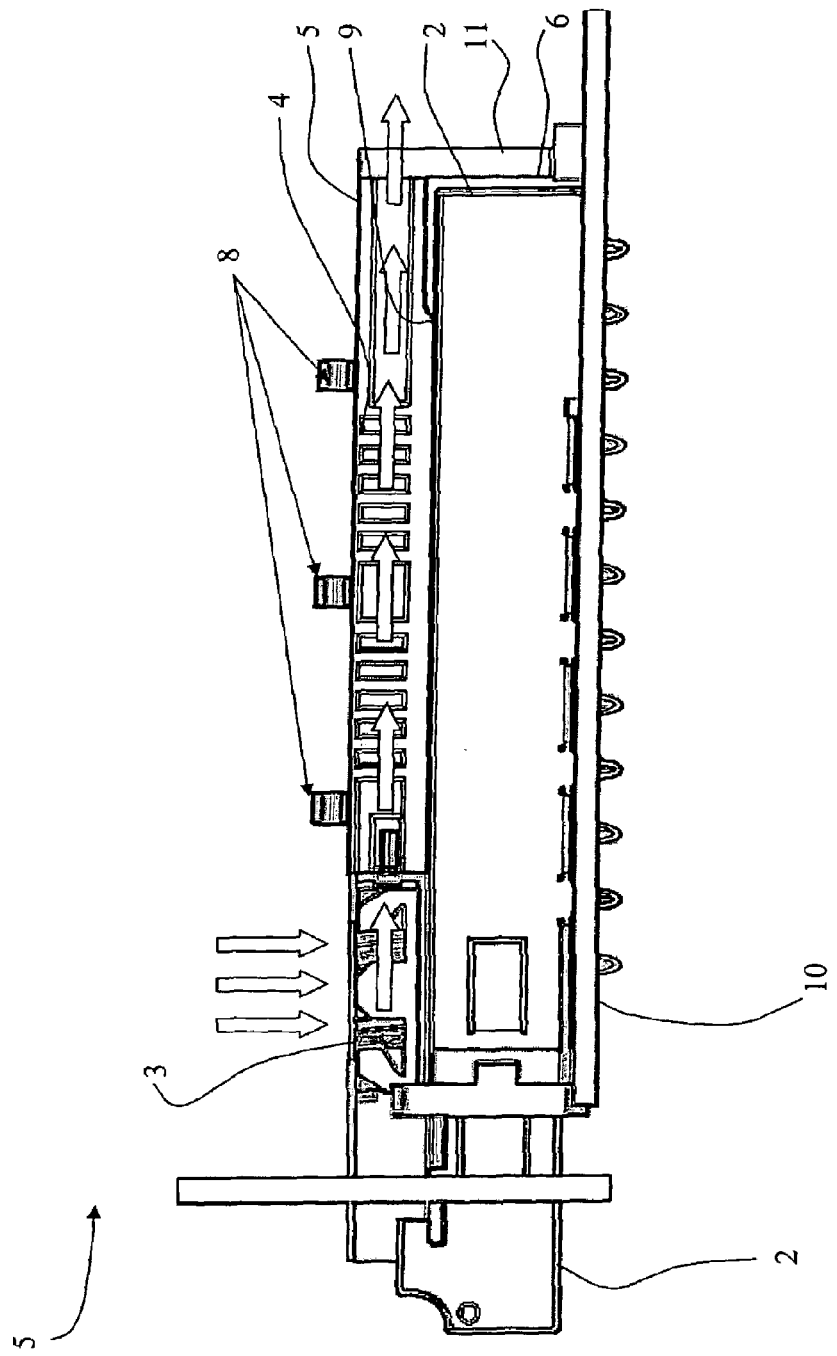
FIG. 2 is a cross-sectional view in which arrows show air flows within the module.

Referring to FIGS. 1 and 2 a module 1 comprises a heat-generating device, in this case an optical transceiver 2. The transceiver 2 itself is not the subject of the invention. The module 1 also comprises an axial fan 3 mounted over part of the transceiver 2, a heat exchanger 4, and an exhaust 5. The device 2 is surrounded (except at its front) by an EMI shield 6. The heat exchanger is pressed against the device 2 through a rectangular opening 9 in the EMI shield 6, allowing direct contact. The heat exchanger 4, the fan 3, and the exhaust 5 are an integral unit held in place by a clamp 7 having arms 8, which extend across and press down against the unit. The clamp 7 both holds the unit 3, 4, 5 in place and also actively presses the heat exchanger 4 down against the device 2 through the opening in the EMI shield 6 as best shown in FIG. 2. FIG. 2 also shows a PCB 10 for the device 2, and a power terminal 11 for the fan.

In operation, the fan 3 sucks air from above, and blows it through the heat exchanger 4 and out the exhaust 5. Air flows are shown by arrows in FIG. 2. The heat flow is by conduction from the device 2 (through the opening 9) and into the heat exchanger 4, and thence into the blown air, which then exits the exhaust 5.

The fan 3 may be operated in the reverse direction to suck air into the exhaust 5, through the heat exchanger 4, and blowing it upwardly.

As the clamp 7 only physically contacts the walls of the heat exchanger 4 and the exhaust 5 at a series of short bar lengths 8, heat transfer by conduction to the rack is minimised.

It will be appreciated that the invention therefore allows individually-controlled cooling of each specific device, thus leading to excellent component reliability. Thus, the manufacturer is in control of the operating environment of the device. The elongate configuration allows compact modular installation on a rack, not taking up any more rack width than the conventional width. The modules will also be cooler for the same environmental conditions when compared to a conventional rack/chassis, thus improving reliability and making it easier for technicians to handle them. Should a fan be faulty, then it will only be one module that is affected rather than them all. If the modules are arranged in a particular way then even if one fan becomes faulty its device may still see enough airflow from surrounding fans to continue to operate satisfactorily until repair or replacement.

On the latter point, it is envisaged that a deflector may be mounted on the rack for cooling air distribution to neighbouring modules.

It will also be appreciated that because most of the transceiver's heat is generated at the mid/rear, where the laser and circuit are located, this is where the heat exchanger has most effect, the fan being at the front.

Figure 3:
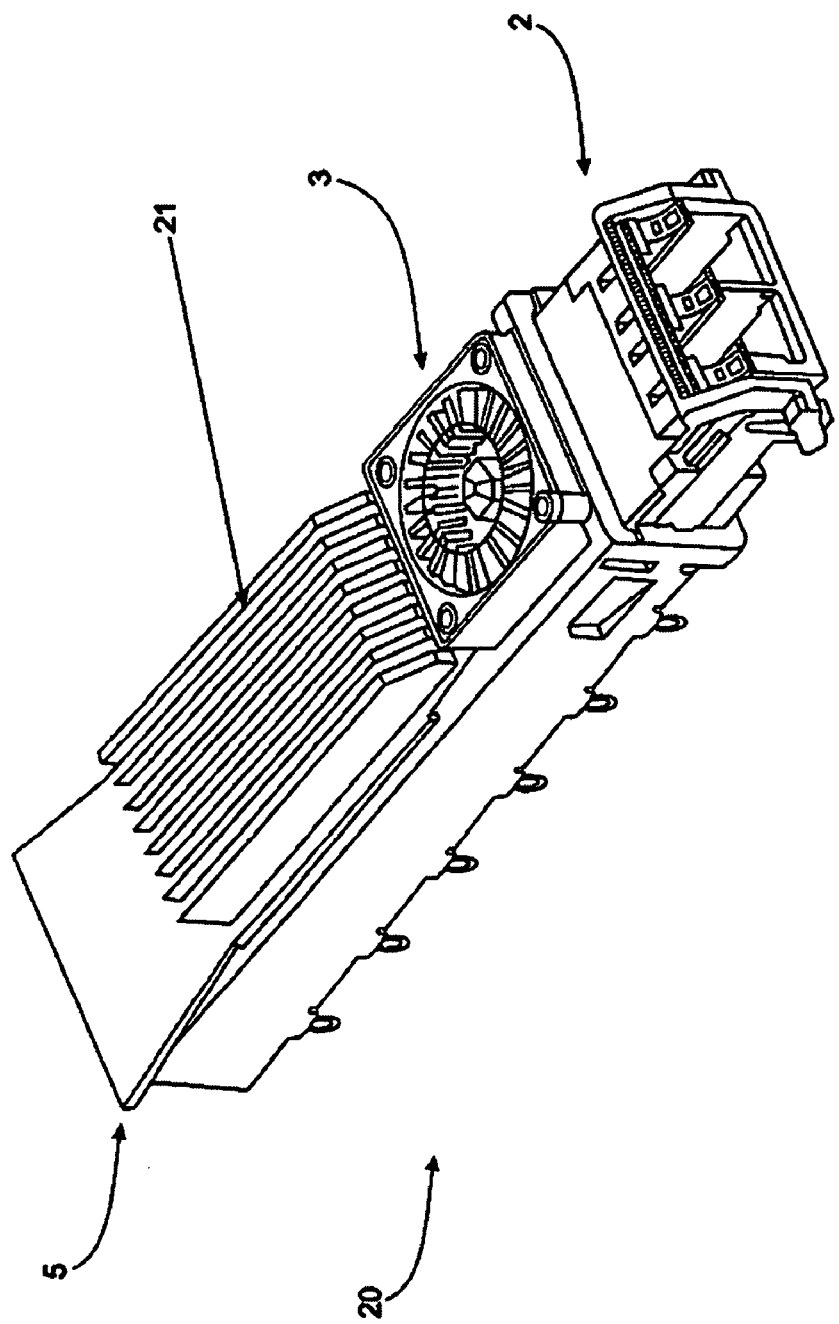
FIGS. 3 and 4 are perspective views of alternative modules, having different heat exchangers.

Referring to FIG. 3 an alternative module 20 has an open heat exchanger 21. This arrangement allows airflow from a source other than the fan 3 of the particular device 2. Thus in the event of a fault in the fan, the module would still see a level of cooling that is seen in many conventional transceivers of the prior art.

Figure 4:
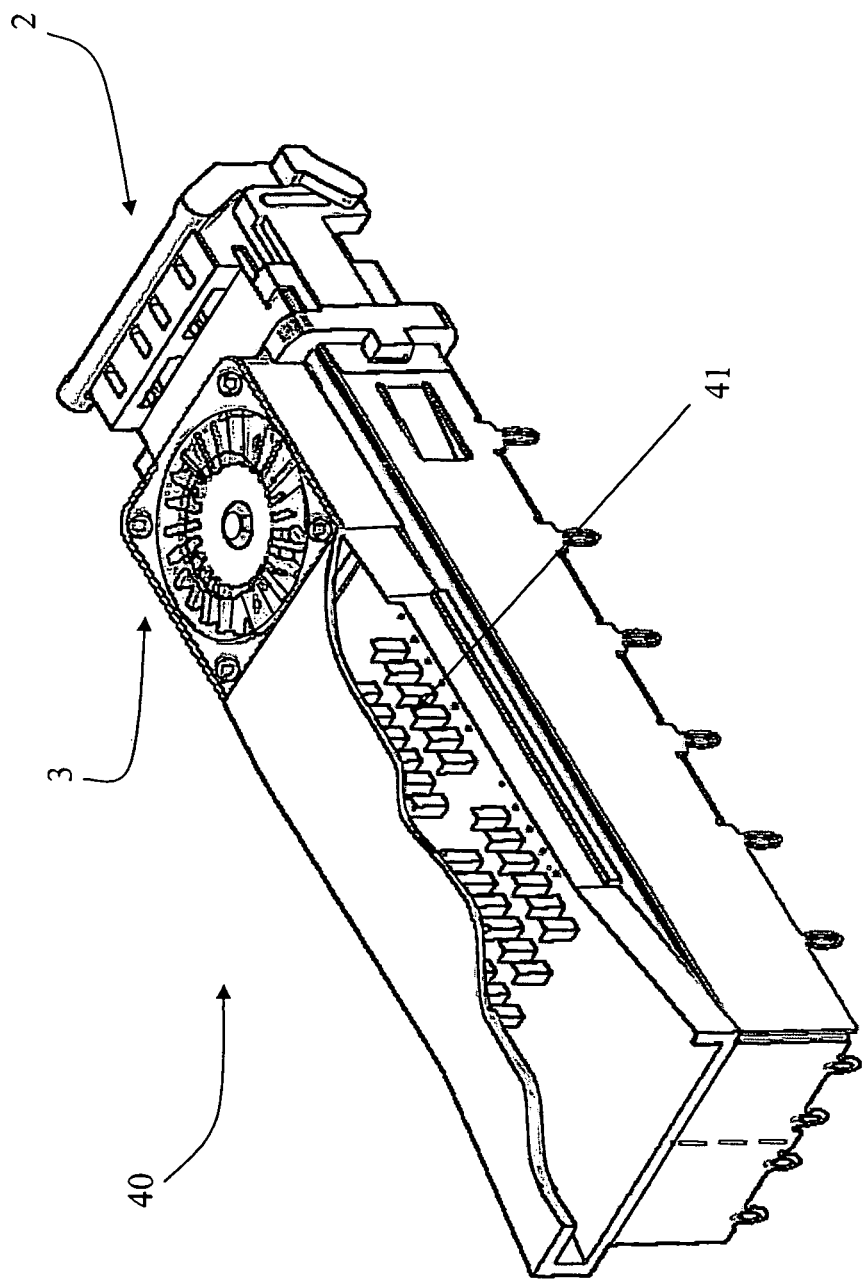

Referring to FIG. 4 a module 40 has a closed heat exchanger 41 having a pin fin array. In this arrangement, air from the mounted fan is forced through the heat exchanger, maximising airflow and cooling along its entire length.

Figure 5A:
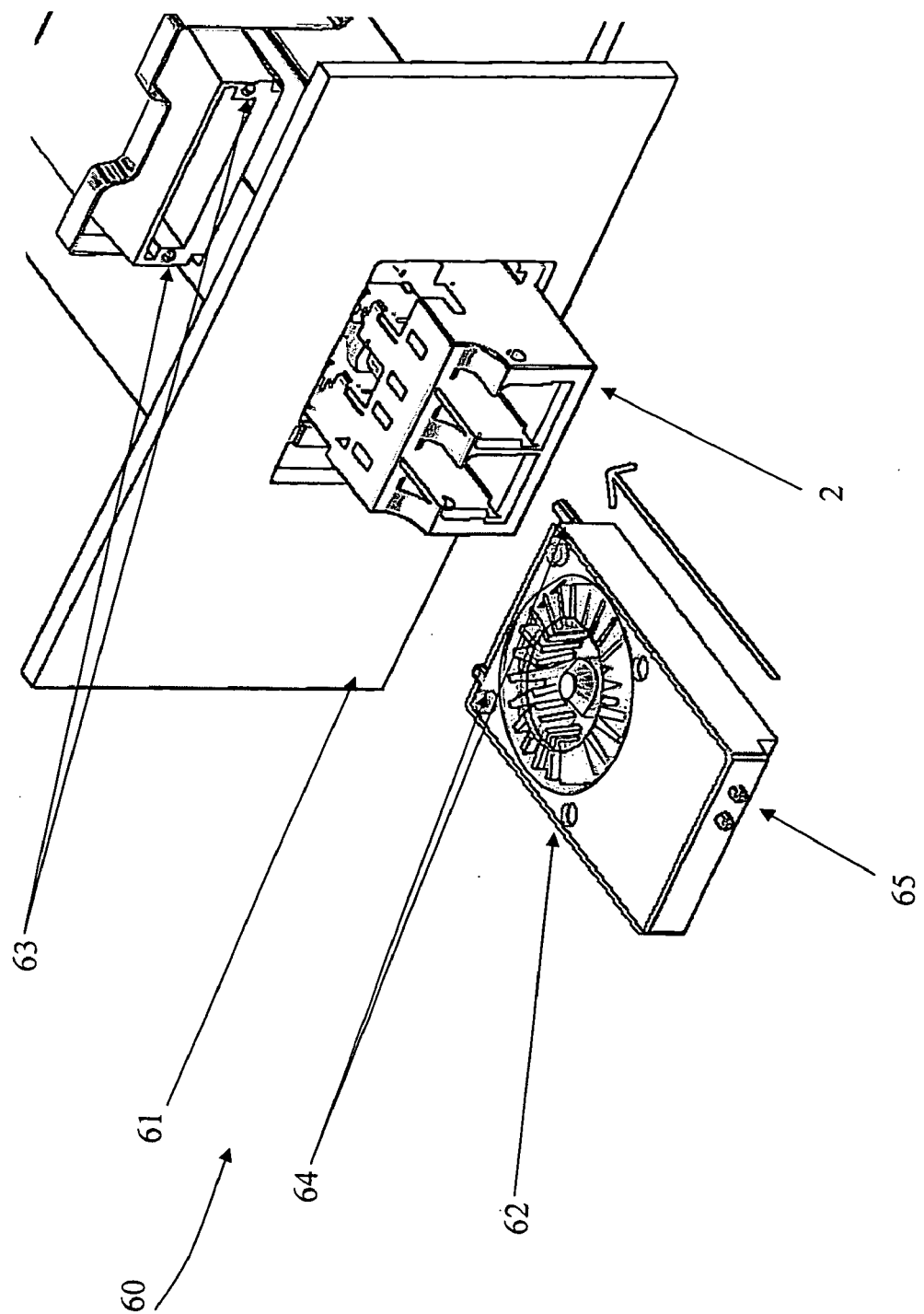
FIG. 5(*a*) is a perspective view of a module having a pluggable fan, showing the fan being inserted.
Figure 5B:
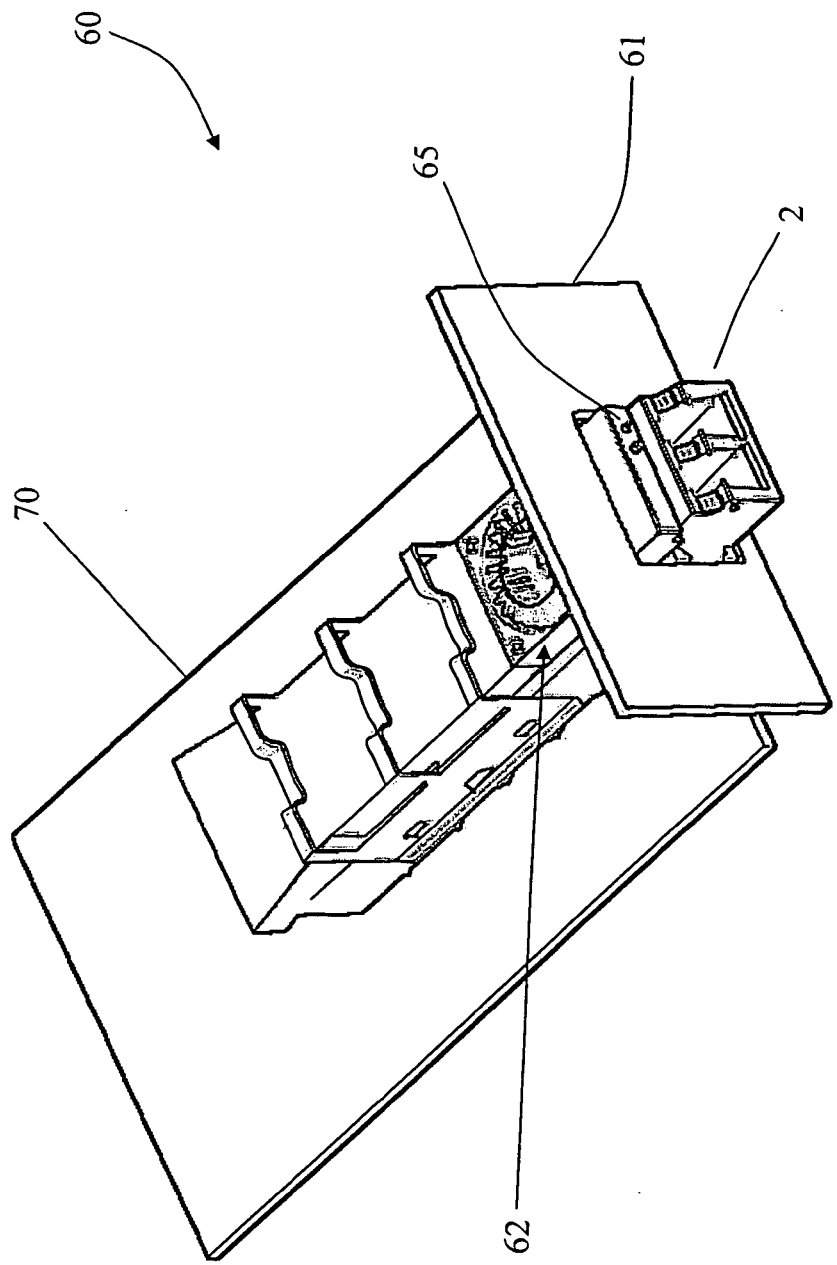

Referring to FIGS. 5(a) and 5(b) a module 60 has a front plate 61 through which the transceiver 2 protrudes. The opening in the front plate 61 is large enough to also accommodate a pluggable fan 62, which is pushed through the opening above the transceiver 2, for engagement with mechanical and electrical sockets 63. The fan 62 includes mechanical and electrical connectors 64 for engagement with the sockets 63, and light emitting diodes 65 to indicate operating status. FIG. 5(b) also shows a PCB 70 for the module. Power is brought to the connectors 63 by conductors (not shown) extending along the length of the heat exchanger.

This arrangement provides modularity at the fan level, for easy replacement. This is particularly advantageous as the fan is the only moving part. This arrangement allows end users to easily replace a faulty fan quickly enough to ensure the transceiver does not become faulty. Also, electrical power for the fan is brought by a conductor on the heat exchanger. Thus, there is no need to modify the basic power/signal connector arrangement at the rear of the device. The status indicators 65 allow very quick identification of faulty fans.

Figure 6:
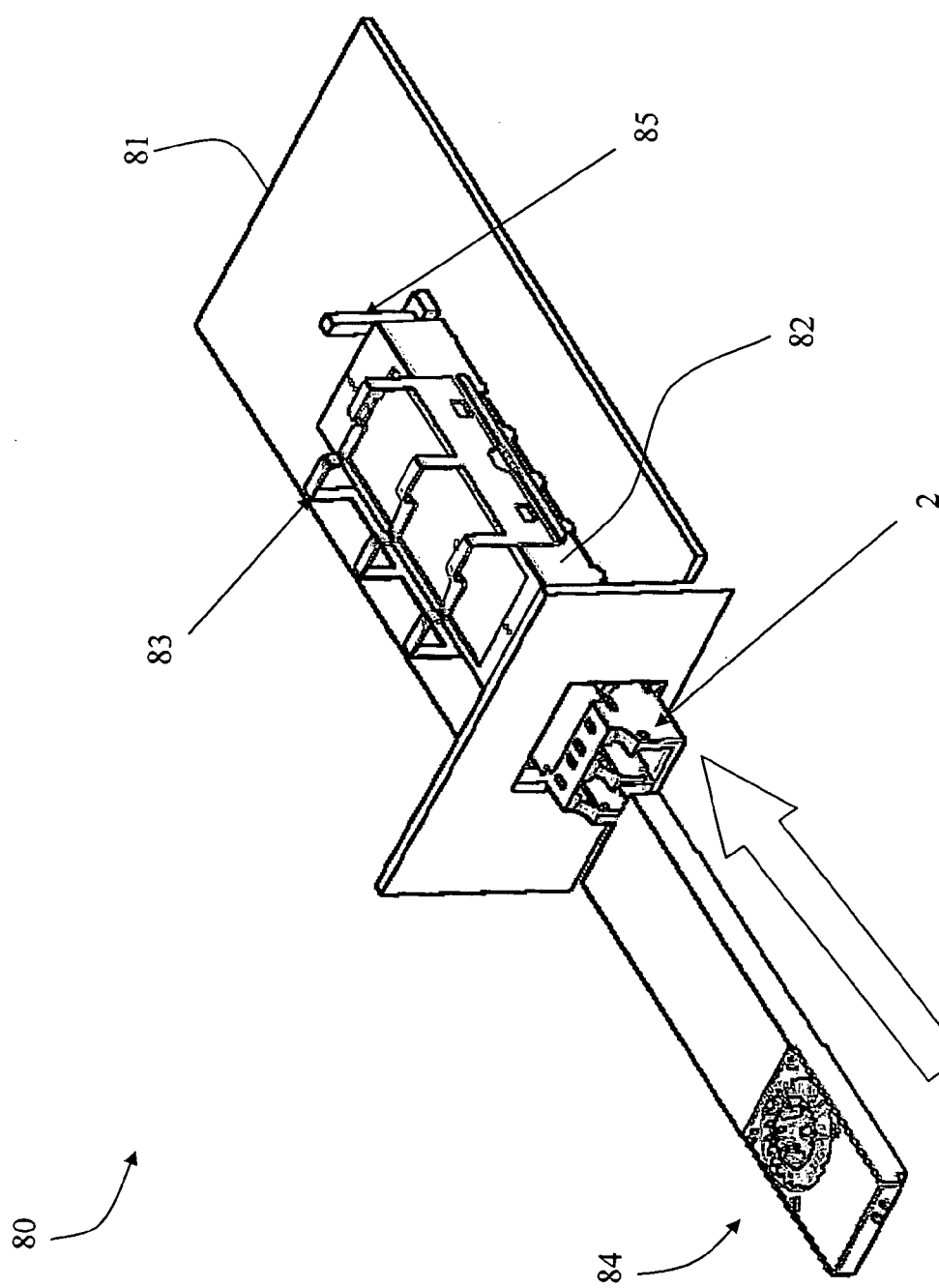
FIG. 6 is a perspective view of an alternative module, showing insertion of a pluggable fan/heat exchanger.

Referring to FIG. 6 a module 80 comprises a transceiver 2 on a PCB 81, an EMI shield 82, and a clamp 83 for receiving a fan/heat exchanger module 84. The module 84 is securely retained in place by the clamp 83. The module 80 also comprises an electrical connector 85. This is at the rear of the module 80, conveniently located where the device's electrical connectors are also located.

Figure 7:
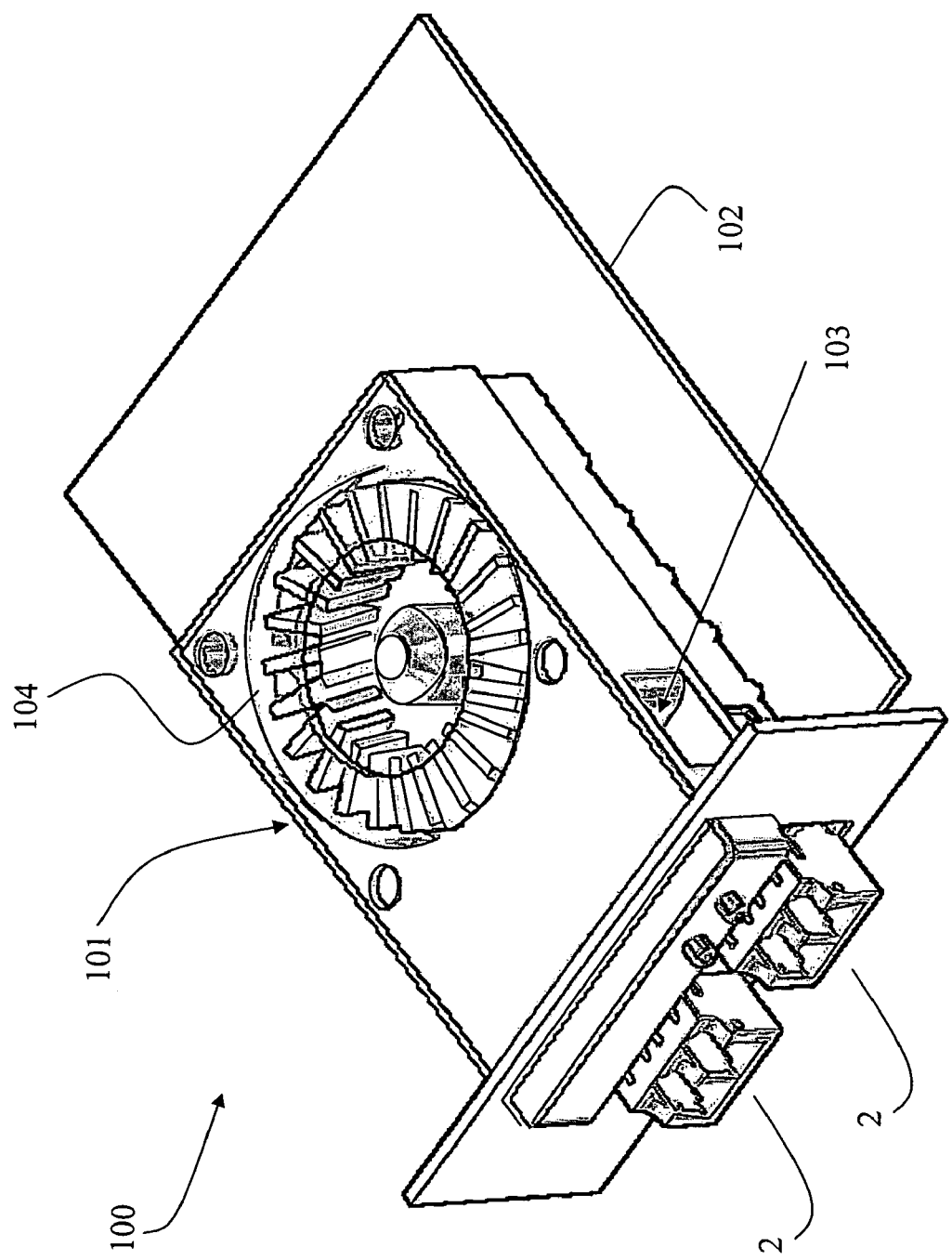
FIG. 7 is a perspective view of a still further module, incorporating two transceivers.

Referring to FIG. 7 a module 100 has a single fan and heat exchanger unit 101 mounted for cooling two transceivers 2 mounted on a PCB 102. In this embodiment, there is a side-inlet 103. Exhaust air is blown upwardly from the fan 104 of the unit 101. Again, in the module 100 the unit 101 is pluggable so that it is itself modular within the module 100.

It will be appreciated that the invention provides for improved reliability of heat-generating components without sacrificing rack density. The manufacturer is in complete control of the operating environment of the device, the module in effect creating a micro-environment. Thus, the environment can be exactly "tailored" to suit the characteristics of the device. The transceiver could monitor its own temperature through use of an internal thermistor or the thermocouple and then process this information into a fan controller (located in the transceiver). Leads from the fan controller could communicate with the fan (through a similar path as the fan power leads), which vary the voltage to the fan, thus controlling its speed. In doing this, the transceiver could speed up the fan when it becomes hot and similarly it could slow it down/shut it off if little or no cooling was required. This would be advantageous, as it would allow the system in which the fans are installed to minimise the power dissipation of the fans and hence reduce overall system power dissipation.

Another major advantage is that the fan may be easily replaced in some embodiments, because it is pluggable. This is, from a practical viewpoint, very advantageous as it allows the end user to easily carry out preventative maintenance, quickly replacing a pluggable fan before a device becomes faulty.

The invention is not limited to the embodiments described but may be varied in construction and detail. For example, the transceiver may be electrical only, operating over copper rather than fibre optic cabling. Also, the transceivers may be used in PCI card applications instead of rack/chassis arrangements.

The invention claimed is:

1. A rack, comprising:
   a front plate defining an opening;
   a printed circuit board;
   a transceiver module mounted through the opening to the printed circuit board so that the transceiver module has a first end protruding through the opening;
   a fan module mounted to the transceiver module near the first end, wherein the fan module is plugged into the transceiver module and one end of the fan module protrudes through the opening so the fan module can be unplugged form the transceiver module and replaced with another when the fan module becomes defective;
   a heat exchanger mounted to the transceiver module near a second end of the transceiver module.

2. The rack of claim 1, wherein:
   the fan module comprises only a fan; and
   the transceiver module comprises a transceiver and the heat, the heat exchanger being mounted on the transceiver, the transceiver module comprising a connector, the fan module being plugged into the connector.

3. The rack of claim 1, wherein:
   the fan module comprises a fan and the heat exchanger; and
   the transceiver module comprises a transceiver and a connector, the fan module being plugged into the connector.

4. The rack of claim 1, further comprising an EMI shield surrounding at least portions of the transceiver module.

5. The rack of claim 1, wherein the heat exchanger comprises open heat exchanger elements.

6. The rack of claim 1, wherein the heat exchanger comprises a pin fin array.

7. The rack of claim 1, further comprising a temperature monitor.

8. The rack of claim 1, further comprising a fan controller operably connected to the temperature monitor for controlling the fan module in response to a sensed temperature.

9. The rack of claim 1, wherein the fan module and the heat exchanger form an integral removable unit.

10. The rack of claim 1, further comprising a status indicator configured to provide a visual indication of the fan module being faulty.

11. The rack of claim 1, wherein the fan module is configured to blow air bi-directionally.

12. The rack of claim 1, further comprising an exhaust configured to exhaust air blown through or across the heat exchanger by the fan module.

13. The rack of claim 12, wherein the fan module, the heat exchanger and the exhaust are configured in-line from the first end to the second end of the transceiver module, respectively.

* * * * *

UNITED STATES PATENT AND TRADEMARK OFFICE
CERTIFICATE OF CORRECTION

PATENT NO. : 7,317,617 B2  
APPLICATION NO. : 11/255480  
DATED : January 8, 2008  
INVENTOR(S) : David Meadowcroft et al.

Page 1 of 1

It is certified that error appears in the above-identified patent and that said Letters Patent is hereby corrected as shown below:

On the Title page insert item [30]:

-- Foreign Application Priority Data  
    Date        Code        Application Number  
October 21, 2004    GB        0423344.1 --.

Column 4, Line 30 (Approx.), Claim 1, after "so" delete "that";

Column 4, Line 37 (Approx.), Claim 1, after ",", insert -- and --;

Column 4, Line 43 (Approx.), Claim 2, delete "heat," and insert -- heat exchanger, --.

Signed and Sealed this  
Twenty-eighth Day of December, 2010

David J. Kappos  
*Director of the United States Patent and Trademark Office*